United States Patent
Lee

(10) Patent No.: US 8,994,421 B1
(45) Date of Patent: Mar. 31, 2015

(54) SYNCHRONIZATION CIRCUIT AND SEMICONDUCTOR APPARATUS USING THE SAME

(71) Applicant: SK Hynix Inc., Icheon-si Gyeonggi-do (KR)

(72) Inventor: Hyun Sung Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/195,010

(22) Filed: Mar. 3, 2014

(30) Foreign Application Priority Data

Nov. 6, 2013 (KR) .................. 10-2013-0134310

(51) Int. Cl.
| H03L 7/06 | (2006.01) |
| H03L 7/08 | (2006.01) |
| H03L 7/10 | (2006.01) |
| G11C 7/22 | (2006.01) |

(52) U.S. Cl.
CPC .............. *H03L 7/0805* (2013.01); *H03L 7/10* (2013.01); *G11C 7/222* (2013.01)
USPC .......................................... 327/158; 327/149

(58) Field of Classification Search
None
See application file for complete search history.

(56) References Cited

U.S. PATENT DOCUMENTS

| 8,373,478 | B2 * | 2/2013 | Ku .................................. 327/158 |
| 8,766,688 | B2 * | 7/2014 | Choi .............................. 327/158 |
| 2004/0196725 | A1 * | 10/2004 | Kang ........................ 365/230.08 |
| 2010/0165761 | A1 * | 7/2010 | Kim et al. ..................... 365/193 |
| 2010/0226188 | A1 * | 9/2010 | Kim et al. ..................... 365/194 |
| 2011/0012654 | A1 * | 1/2011 | Shin et al. ..................... 327/158 |
| 2011/0234280 | A1 * | 9/2011 | Na .................................. 327/158 |
| 2012/0274373 | A1 * | 11/2012 | Ku .................................. 327/158 |

FOREIGN PATENT DOCUMENTS

| KR | 1020120037356 A | 4/2012 |
| KR | 101153805 B1 | 5/2012 |

* cited by examiner

*Primary Examiner* — Cassandra Cox
(74) *Attorney, Agent, or Firm* — William Park & Associates Patent Ltd.

(57) ABSTRACT

A synchronization circuit may include: a variable delay unit configured to delay a first clock signal by a first delay time set in response to a delay control signal and generate a second clock signal; a first path configured to detect a phase difference between the first clock signal and a third clock signal generated by delaying the second clock signal by a second delay time and generate a phase difference detection signal; a second path configured to generate a second phase difference detection signal in response to a phase difference between the first clock signal and a fourth clock signal; and a control unit configured to generate the delay control signal in response to the phase difference detection signal and vary an update period of the delay control signal in response to the second phase difference detection signal.

20 Claims, 3 Drawing Sheets

SYNCHRONIZATION CIRCUIT AND SEMICONDUCTOR APPARATUS USING THE SAME

CROSS-REFERENCES TO RELATED APPLICATION

The present application claims priority under 35 U.S.C. §119(a) to Korean application number 10-2013-0134310, filed on Nov. 6, 2013, in the Korean Intellectual Property Office, which is incorporated herein by reference in its entirety.

BACKGROUND

1. Technical Field

Various embodiments relate to a semiconductor apparatus, and more particularly, to a synchronization circuit and a semiconductor apparatus using the same.

2. Related Art

In a semiconductor apparatus, for example, a semiconductor memory, a delay time of a path through which an external clock signal provided from a controller is transferred is different from a delay time of a path through which data is outputted from the semiconductor memory.

Due to the difference in delay time between the two paths, the phase information of the data outputted from the semiconductor memory cannot be determined on the basis of the external clock signal.

Thus, when transmitting data to the controller, the semiconductor memory also transmits a data strobe signal DQS synchronized with the data.

At this time, a delay locked loop (DLL) may be used as a synchronization circuit to synchronize the phase of the data strobe signal outputted from the semiconductor memory with the phase of the external clock signal provided from the controller.

SUMMARY

Various embodiments are directed to a synchronization circuit capable of reducing a delay locking time and a semiconductor apparatus using the same.

In an embodiment, a synchronization circuit may include: a variable delay unit configured to delay a first clock signal by a first delay time set in response to a delay control signal and generate a second clock signal; a first path configured to detect a phase difference between the first clock signal and a third clock signal generated by delaying the second clock signal by a second delay time and generate a phase difference detection signal; a second path configured to generate a second phase difference detection signal in response to a phase difference between the first clock signal and a fourth clock signal generated by delaying the third clock signal by a third delay time; and a control unit configured to generate the delay control signal in response to the phase difference detection signal and vary an update period of the delay control signal in response to the second phase difference detection signal.

In an embodiment, a semiconductor apparatus may include: an input buffer configured to receive an external clock signal and generate a first clock signal; an output buffer configured to receive a second clock signal and output the received second clock signal; a data output block configured to output data and a data strobe signal in response to an output signal of the output buffer; and a synchronization circuit configured to vary a delay time of the first clock signal, generate the second clock signal by compensating for a phase difference between the external clock signal and the data strobe signal, and vary a delay time update period of the first clock signal before and after a first timing before the first clock signal and the third clock signal have substantially the same phase.

The synchronization circuit may be configured to set the delay time update period of the first clock signal before the first timing close to delay locking to a shorter period than the delay time update period of the first clock signal after the first timing.

BRIEF DESCRIPTION OF THE DRAWINGS

Features, aspects, and embodiments are described in conjunction with the attached drawings, in which.

DETAILED DESCRIPTION

Hereinafter, a synchronization circuit and a semiconductor apparatus using the same will be described below with reference to the accompanying drawings through various examples of embodiments.

Figure 1:
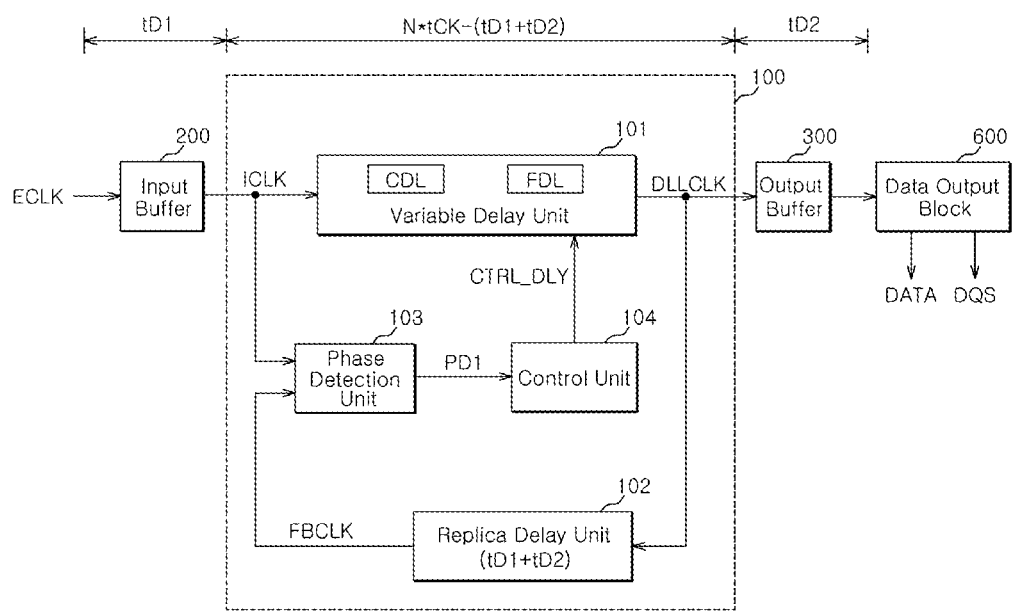
FIG. 1 is a block diagram of a semiconductor apparatus according to an embodiment.

Referring to FIG. 1, a semiconductor apparatus 10 according to an embodiment may include a synchronization circuit including a delay locked loop (DLL) 100, an input buffer 200, an output buffer 300, and a data output block 600.

The input buffer 200 may be configured to receive an external clock signal ECLK and generate a first clock signal, that is, an internal clock signal ICLK.

The output buffer 300 may be configured to receive a second clock signal, that is, a delay compensation clock signal DLLCLK and provide the received signal to the data output block 600.

The data output block 600 may be configured to output data DATA and a data strobe signal DQS based on the delay compensation clock signal DLLCLK.

The DLL 100 may be configured to generate the delay compensation clock signal DLLCLK by compensating for a phase difference between the first clock signal, that is, the internal clock signal ICLK and a third clock signal, that is, a feedback clock signal FBCLK.

The DLL 100 may include a variable delay unit 101, a replica delay unit 102, a phase detection unit 103, and a control unit 104.

The variable delay unit 101 may be configured to delay the internal clock signal ICLK by a first delay time set in response to a delay control signal CTRL_DLY and generate the delay compensation clock signal DLLCLK.

Additionally, the variable delay unit 101 may include a coarse delay line CDL and a fine delay line FDL.

The replica delay unit 102 may be configured to delay the delay compensation clock signal DLLCLK by a second delay time and generate the feedback clock signal FBCLK.

Additionally, the second delay time may correspond to a delay time obtained by adding a delay time tD1 of the input buffer 200 and a delay time tD2 of the output buffer 300.

The phase detection unit 103 may be configured to detect a phase difference between the internal clock signal ICLK and the feedback clock signal FBCLK and generate a phase difference detection signal PD1.

The control unit 104 may be configured to generate the delay control signal CTRL_DLY in response to previously input phase difference detection signals PD1 at each preset update period.

The control unit 104 may be configured to determine the validities of the previously input phase difference detection signals PD1 and adjust the value of the delay control signal CTRL_DLY at each preset update period.

The operation of the semiconductor apparatus according to the embodiments will be described as follows.

The variable delay unit 101 delays the internal clock signal ICLK by the first delay time set in response to the delay control signal CTRL_DLY and generates the delay compensation clock signal DLLCLK.

The replica delay unit 102 delays the delay compensation clock signal DLLCLK by the second delay time, that is, the delay time obtained by adding the delay time tD1 of the input buffer 200 and the delay time tD2 of the output buffer 300, and generates the feedback clock signal FBCLK.

The phase detection unit 103 detects a phase difference between the internal clock signal ICLK and the feedback clock signal FBCLK and provides the phase difference detection signal PD1 to the control unit 104.

The control unit 104 adjusts the value of the delay control signal CTRL_DLY according to the previously input phase difference detection signals PD1 until the internal clock signal ICLK and the feedback clock signal FBCLK have the same phase within an error range, at each update period.

At this time, a delay time required until the external clock signal ECLK reaches the data output block 600 corresponds to tD1+tDL+tD1+tD2.

Here, tD1 represents the delay time of the input buffer 200, tDL represents the delay time of the variable delay unit 101, and tD2 represents the delay time of the output buffer 300.

When the internal clock signal ICLK and the feedback clock signal FBCLK have substantially the same phase, it may be defined that delay locking is achieved.

Since the internal clock signal ICLK and the feedback clock signal FBCLK have the same phase at the timing at which delay locking is achieved, a phase difference therebetween is N*tCK.

Here, N is an integer, and tCK represents a time corresponding to one period of the clock signals ECLK, ICLK, DLLCLK, and FBCLK.

Furthermore, N*tCK corresponds to a value obtained by subtracting tD1 from (tD1+tDL+tD1+tD2) which is the delay time required until the external clock signal ECLK reaches the data output block 600, that is, tDL+tD1+tD2, and tDL is N*tCK−(tD1+tD2).

As described above, the delay-locked delay compensation clock signal DLLCLK is provided to the data output block 600 through the output buffer 300.

Since the data output block 600 generates the data strobe signal DQS based on the delay compensation clock signal DLLCLK, the data strobe signal DQS has the same phase as the external clock signal ECLK.

Thus, the data DATA and the data strobe signal DQS are outputted according to the timing of the external clock signal ECLK.

Figure 2:
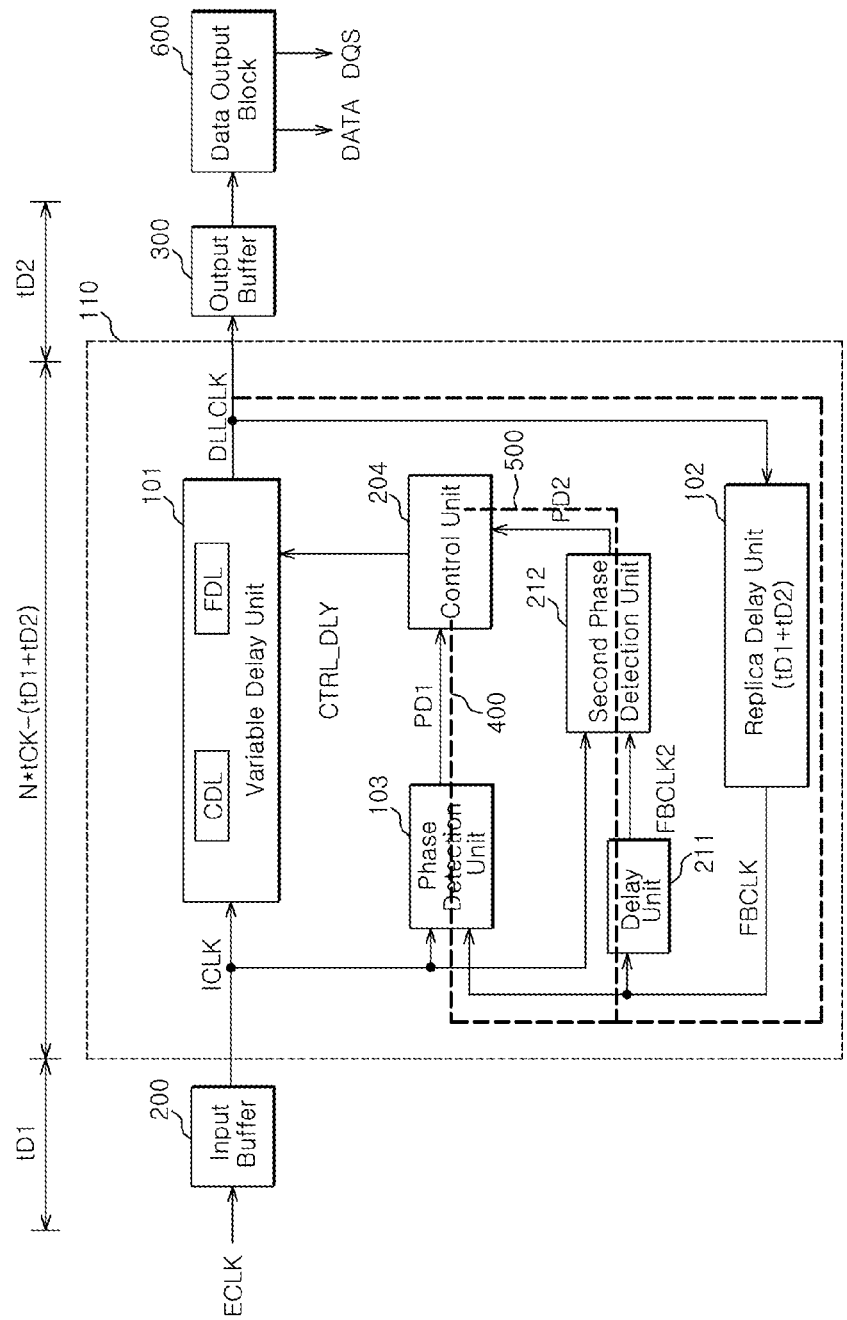
FIG. 2 is a block diagram of a semiconductor apparatus according to an embodiment.

Referring to FIG. 2, a semiconductor device 11 according to an embodiment may include a DLL 110, an input buffer 200, an output buffer 300, and a data output block 600.

The input buffer 200 may be configured to receive an external clock signal ECLK and generate a first clock signal, that is, an internal clock signal ICLK.

The output buffer 300 may be configured to receive a second clock signal, that is, a delay compensation clock signal DLLCLK and provide the received signal to the data output block 600.

The data output block 600 may be configured to output data DATA and a data strobe signal DQS based on the delay compensation clock signal DLLCLK.

The DLL 110 may be configured to generate the delay compensation clock signal DLLCLK by compensating for a phase difference between the internal clock signal ICLK whose delay time is varied in response to a delay control signal and a third clock signal, that is, a feedback clock signal FBCLK.

The DLL 110 may be configured to vary the update period of the delay control signal CTRL_DLY in response to a phase difference between the internal clock signal ICLK and a fourth clock signal generated by delaying the feedback clock signal FBCLK.

Additionally, when the internal clock signal ICLK and the feedback clock signal FBCLK have substantially the same phase, it may be defined that delay locking is achieved.

The DLL 110 may be configured to set the update period of the delay control signal CTRL_DLY to a shorter period before delay locking than after delay locking.

The DLL 110 may include a variable delay unit 101, a first path 400, a second path 500, and a control unit 204.

The variable delay unit 101 may be configured to delay the internal clock signal ICLK by a first delay time set in response to the delay control signal CTRL_DLY and generate the delay compensation clock signal DLLCLK.

Additionally, the variable delay unit 101 may include a coarse delay line CDL and a fine delay line FDL.

Each of the coarse delay line CDL and the fine delay line FDL may include a plurality of unit delays.

The DLL 110 may sequentially perform a coarse delay locking operation for adjusting the delay time of the coarse delay line CDL and a fine delay locking operation for adjusting the delay time of the fine delay line FDL, thereby achieving a delay locking state in which the internal clock signal ICKL and the feedback clock signal FBCLK have substantially the same phase.

The first path 400 may be configured to detect a phase difference between the internal clock signal ICLK and the feedback clock signal FBCLK generated by delaying the delay compensation clock signal DLLCLK by a second delay time and generate a phase difference detection signal PD1.

The first path 400 may include a replica delay unit 102 and a phase detection unit 103.

The replica delay unit 102 may be configured to delay the delay compensation clock signal DLLCLK by a second delay time and generate the feedback clock signal FBCLK.

At this time, the second delay time may correspond to a delay time obtained by adding a delay time tD1 of the input buffer 200 and a delay time tD2 of the output buffer 300.

The phase detection unit 103 may be configured to detect a phase difference between the internal clock signal ICLK and the feedback clock signal FBCLK and generate the phase difference detection signal PD1.

The second path 500 may be configured to detect a phase difference between the internal clock signal ICLK and a fourth clock signal generated by delaying the feedback clock signal FBCLK by a third delay time, that is, a second feedback clock signal FBCLK2, and generate a second phase difference detection signal PD2.

The second path 500 may include a delay unit 211 and a second phase detection unit 212.

The delay unit 211 may be configured to delay the feedback clock signal FBCLK by the third delay time and generate the second feedback clock signal FBCLK2.

At this time, the delay time of the delay unit 211 may have a larger value than the unit delay of the coarse delay line CDL of the variable delay unit 101, for example, a two times larger value than the unit delay.

The second phase detection unit 212 may be configured to detect a phase difference between the second feedback clock signal FBCLK2 and the internal clock signal ICLK and generate the second phase difference detection signal PD2.

The control unit 204 may be configured to generate the delay control signal CTRL_DLY in response to the phase difference detection signal PD1, and vary the update period of the delay control signal CTRL_DLY in response to the second phase difference detection signal PD2.

The control unit 204 may be configured to determine the validities of the previously input phase difference detection signals and adjust the value of the delay control signal CTRL_DLY, at each update period.

Figure 3:
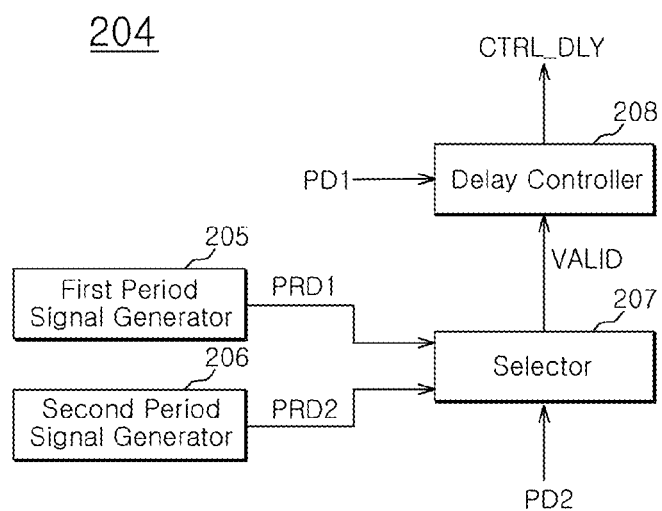
FIG. 3 is a block diagram illustrating the internal configuration of a control unit of FIG. 2.

Referring to FIG. 3, the control unit 204 may include a first period signal generator 205, a second period signal generator 206, a selector 207, and a delay controller 208.

The first period signal generator 205 may be configured to generate a first period signal PRD1.

The second period signal generator 206 may be configured to generate a second period signal PRD2.

Additionally, the second period signal PRD2 may have a shorter period than the first period signal PRD1.

The selector 207 may be configured to select the first period signal PRD1 or the second period signal PRD2 in response to the second phase detection signal PD2 and output the selected signal as a valid signal VALID.

The selector 207 may select the second period signal PRD2 and output the selected signal as the valid signal VALID, before the transition of the second phase difference detection signal PD2 occurs. Furthermore, the selector 207 may select the first period signal PRD1 and output the selected signal as the valid signal VALID, when the transition of the second phase difference detection signal PD2 is detected.

Before the transition of the second phase difference detection signal PD2 occurs, it may indicate that the delay locking of the DLL 110 is not yet achieved. When the transition of the second phase difference detection signal PD2 is detected, it may indicate that delay locking may be achieved within a predetermined time. This will be described below in more detail.

The delay controller 208 may be configured to adjust the value of the delay control signal CTRL_DLY in response to the previously input phase difference detection signals PD1, at each period where the valid signal VALID is generated.

That is, the delay controller 208 adjusts the value of the delay control signal CTRL_DLY to the update period based on the second period signal PRD2 having a shorter period than the first period signal PRD1, when delay locking of the DLL 110 is not achieved.

The delay controller 208 changes the update period to the update period based on the first period signal PRD1 and adjusts the value of the delay control signal CTRL_DLY to, when delay locking of the DLL 110 is almost achieved.

The operation of the semiconductor apparatus according to an embodiment will be described as follows.

Referring to FIG. 2, the variable delay unit 101 delays the internal clock signal ICLK by the delay time set in response to the delay control signal CTRL_DLY and generates the delay compensation clock signal DLLCLK.

The replica delay unit 102 delays the delay compensation clock signal DLLCLK by the second delay time, that is, the delay time obtained by adding the delay time tD1 of the input buffer 200 and the delay time tD2 of the output buffer 300, and generates the feedback clock signal FBCLK.

The phase detection unit 103 detects a phase difference between the internal clock signal ICLK and the feedback clock signal FBCLK and provides the phase difference detection signal PD1 to the control unit 204.

The delay unit 211 of the second path 500 delays the feedback clock signal FBCLK by a preset delay time and generates the second feedback clock signal FBCLK2.

The second phase detection unit 212 detects a phase difference between the internal clock signal ICLK and the second feedback clock signal FBCLK2 and provides the second phase difference detection signal PD2 to the control unit 204.

At this time, the second feedback clock signal FBCLK2 may be obtained by delaying the feedback clock signal FBCLK by a preset time, that is, a time two times longer than the unit delay of the coarse delay line CDL of the variable delay unit 101.

The second feedback clock signal FBCLK2 has phase information through which the delay time control result of the first path 400 based on the feedback clock signal FBCLK may be previously estimated.

At this time, the coarse delay locking operation for adjusting the delay time of the coarse delay line CDL of the variable delay unit 101 is not yet completed.

Thus, the control unit 204 (See also FIG. 3) adjusts the value of the delay control signal CTRL_DLY to an update period based on the second period signal PRD2 having a shorter period than the first period signal PRD1 in response to the phase difference detection signal PD1, before coarse delay locking is not achieved, that is, the transition of the second phase difference detection signal PD2 occurs.

The control unit 204 adjusts the value of the delay control signal CTRL_DLY to an update period based on the second period signal PRD2 having a shorter period than the first period signal PRD1 in response to the phase difference detection signal PD1, when the transition of the second phase difference detection signal PD2 occurs.

At this time, the second feedback clock signal FBCLK2 has phase information through which the delay time control result of the first path 400 based on the feedback clock signal FBCLK may be previously estimated.

Thus, when the transition of the second phase detection signal PD2 is detected, it may indicate that the transition of the phase difference detection signal PD1 based on the feedback clock signal FBCLK will occur within a predetermined time, for example, tCK. That is, it may indicate that coarse delay locking will be achieved.

The second path 500 may recover the update period of the delay control signal CTRL_DLY to a stable value at a timing close to the achievement of the coarse delay locking (i.e., at a first timing close to delay locking). Then, the coarse delay locking operation and the fine delay operation may be completed.

The control unit 104 determines the previously input phase difference detection signals PD1 at each update period which is varied by the second path 500, and adjusts the value of the delay control signal CTRL_DLY such that the internal clock signal ICLK and the feedback clock signal FBCLK have the same phase within an error range.

At this time, the delay time required until the external clock signal ECLK reaches the data output block 600 is tD1+tDL+tD1+tD2.

Here, tD1 represents the delay time of the input buffer 200, tDL represents the delay time of the variable delay unit 101, and tD2 represents the delay time of the output buffer 300.

When the internal clock signal ICLK and the feedback clock signal FBCLK have the same phase within an error range, it may be defined that delay locking is achieved.

Since the internal clock signal ICLK and the feedback clock signal FBCLK have the same phase at the timing at which delay locking is achieved, a phase difference therebetween is N*tCK.

Here, N is an integer, and tCK represents a time corresponding to one period of the clock signals ECLK, ICLK, DLLCLK, and FBCLK.

Furthermore, N*tCK corresponds to a value obtained by subtracting tD1 from the delay time (tD1+tDL+tD1+tD2) required until the external clock signal ECLK reaches the data output block 600, that is, tDL+tD1+tD2, and tDL corresponds to N*tCK−(tD1+tD2).

As described above, the delay-locked delay compensation clock signal DLLCLK is provided to the data output block 600 through the output buffer 300.

Since the data output block 600 generates the data strobe signal DQS based on the delay compensation clock signal DLLCLK, the data strobe signal DQS has the same phase as the external clock signal ECLK.

Thus, the data DATA and the data strobe signal DQS are outputted according to the timing of the external clock signal ECLK.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A synchronization circuit comprising:
a variable delay unit configured to delay a first clock signal by a first delay time set in response to a delay control signal and generate a second clock signal;
a first path configured to detect a phase difference between the first clock signal and a third clock signal generated by delaying the second clock signal by a second delay time and generate a phase difference detection signal;
a second path configured to generate a second phase difference detection signal in response to a phase difference between the first clock signal and a fourth clock signal generated by delaying the third clock signal by a third delay time; and
a control unit configured to generate the delay control signal in response to the phase difference detection signal and vary an update period of the delay control signal in response to the second phase difference detection signal.

2. The synchronization circuit according to claim 1, wherein the control unit is configured to set the update period of the delay control signal before a first timing close to delay locking to a shorter period than the update period of the delay control signal after the first timing.

3. The synchronization circuit according to claim 1, wherein the control unit is configured to set the update period of the delay control signal before transition of the second phase difference detection signal occurs, to a shorter period than the update period of the delay control signal after the transition of the second phase difference detection signal occurs.

4. The synchronization circuit according to claim 1, wherein the variable delay unit comprises a coarse delay line and a fine delay line.

5. The synchronization circuit according to claim 4, wherein the control unit is configured to set the update period of the delay control signal before a first timing close to delay locking of the coarse delay line, to a shorter period than the update period of the delay control signal after the first timing.

6. The synchronization circuit according to claim 1, wherein the control unit comprises:
a selector configured to select a first period signal or second period signal in response to the second phase difference detection signal and output the selected signal as a valid signal; and
a delay controller configured to adjust the value of the delay control signal in response to the phase difference detection signal at each period where the valid signal is generated.

7. The synchronization circuit according to claim 6, wherein before transition of the second phase difference detection signal occurs, the selector selects the second period signal having a shorter period than the first period signal and outputs the selected signal as the valid signal, and
when the transition of the second phase difference detection signal is detected, the selector outputs the first period signal as the valid signal.

8. The synchronization circuit according to claim 1, wherein the first path comprises:
a replica delay unit configured to delay the second clock signal by the second delay time and generate the third clock signal; and
a phase detection unit configured to detect a phase difference between the first clock signal and the third clock signal and generate the phase difference detection signal.

9. The synchronization circuit according to claim 1, wherein the second path comprises:
a delay unit configured to delay the third clock signal by the third delay time and generate the fourth clock signal; and
a second phase detection unit configured to detect a phase difference between the fourth clock signal and the first clock signal and generate the second phase difference detection signal.

10. The synchronization circuit according to claim 4, wherein the second path comprises:
a delay unit configured to generate the fourth clock signal by delaying the third clock signal by the third delay time, and have a larger delay time than the unit delay of the coarse delay line; and
a second phase detection unit configured to detect a phase difference between the fourth clock signal and the first clock signal and generate the second phase difference detection signal.

11. A semiconductor apparatus comprising:
an input buffer configured to receive an external clock signal and generate a first clock signal;
an output buffer configured to receive a second clock signal and output the received second clock signal;
a data output block configured to output data and a data strobe signal in response to an output signal of the output buffer; and
a synchronization circuit configured to vary a delay time of the first clock signal, generate the second clock signal by compensating for a phase difference between the external clock signal and the data strobe signal, generate a third clock signal by delaying the second clock signal, and vary a delay time update period of the first clock signal before and after a first timing before the first clock signal and the third clock signal have substantially the same phase.

12. The semiconductor apparatus according to claim 11, wherein the synchronization circuit is configured to set the delay time update period of the first clock signal before the first timing before the first clock signal and the third clock signal have substantially the same phase to a shorter period than the delay time update period of the first clock signal after the first timing.

13. The semiconductor apparatus according to claim 11, wherein the synchronization circuit comprises:
  a variable delay unit configured to delay the first clock signal by a first delay time set in response to a delay control signal and generate the second clock signal;
  a first path configured to detect a phase difference between the first clock signal and the third clock signal generated by delaying the second clock signal by a second delay time and generate a phase difference detection signal;
  a second path configured to generate a second phase difference detection signal in response to a phase difference between the first clock signal and a fourth clock signal generated by delaying the third clock signal by a third delay time; and
  a control unit configured to generate the delay control signal in response to the phase difference detection signal, and vary the update period of the delay control signal in response to the second phase difference detection signal.

14. The synchronization circuit according to claim 13, wherein the variable delay unit comprises a coarse delay line and a fine delay line.

15. The synchronization circuit according to claim 14, wherein the control unit is configured to set the update period of the delay control signal before the first timing before the first clock signal and the third clock signal have substantially the same phase of the coarse delay line, to a shorter period than the update period of the delay control signal after the first timing.

16. The synchronization circuit according to claim 13, wherein the control unit comprises:

a selector configured to select a first period signal or second period signal in response to the second phase difference detection signal and output the selected signal as a valid signal; and
  a delay controller configured to adjust the value of the delay control signal in response to the phase difference detection signal at each period where the valid signal is generated.

17. The synchronization circuit according to claim 16, wherein before transition of the second phase difference detection signal occurs, the selector selects the second period signal having a shorter period than the first period signal and outputs the selected signal as the valid signal, and
  when the transition of the second phase difference detection signal is detected, the selector outputs the first period signal as the valid signal.

18. The synchronization circuit according to claim 13, wherein the first path comprises:
  a replica delay unit configured to delay the second clock signal by the second delay time and generate the third clock signal; and
  a phase detection unit configured to detect a phase difference between the first clock signal and the third clock signal and generate the phase difference detection signal.

19. The synchronization circuit according to claim 13, wherein the second path comprises:
  a delay unit configured to delay the third clock signal by the third delay time and generate the fourth clock signal; and
  a second phase detection unit configured to detect a phase difference between the fourth clock signal and the first clock signal and generate the second phase difference detection signal.

20. The synchronization circuit according to claim 14, wherein the second path comprises:
  a delay unit configured to generate the fourth clock signal by delaying the third clock signal by the third delay time, and have a larger delay time than the unit delay of the coarse delay line; and
  a second phase detection unit configured to detect a phase difference between the fourth clock signal and the first clock signal and generate the second phase difference detection signal.

* * * * *